(12) United States Patent
Wilson et al.

(10) Patent No.: US 9,722,543 B2
(45) Date of Patent: Aug. 1, 2017

(54) POWER SUPPLY STAGE

(71) Applicant: SnapTrack, Inc., San Diego, CA (US)

(72) Inventors: Martin Paul Wilson, Cambridge (GB); Gerard Wimpenny, Cambridge (GB)

(73) Assignee: SnapTrack, Inc., San Diego, CA (US)

( * ) Notice: Subject to any disclaimer, the term of this patent is extended or adjusted under 35 U.S.C. 154(b) by 6 days.

(21) Appl. No.: 14/797,242

(22) Filed: Jul. 13, 2015

(65) Prior Publication Data

US 2015/0318826 A1 Nov. 5, 2015

Related U.S. Application Data

(63) Continuation of application No. 13/127,624, filed as application No. PCT/EP2009/064632 on Nov. 4, 2009, now Pat. No. 9,106,182.

(30) Foreign Application Priority Data

Nov. 4, 2008 (GB) .................................. 0820177.4

(51) Int. Cl.
 *H02M 3/156* (2006.01)
 *H02M 1/00* (2006.01)
 *H03F 1/02* (2006.01)
 *H03F 3/19* (2006.01)
 *H03F 3/20* (2006.01)
 *H03G 3/20* (2006.01)

(52) U.S. Cl.
 CPC ............. *H03F 1/0227* (2013.01); *H03F 3/19* (2013.01); *H03F 3/20* (2013.01); *H03F 2200/102* (2013.01); *H03F 2200/451* (2013.01)

(58) Field of Classification Search
 CPC ......... H02M 2001/0045; H02M 3/156; H02M 2003/1566; H03F 1/0227; H03F 3/19; H03F 2200/102; H03F 2200/451; H03F 3/20
 USPC .......................................... 330/10, 127, 136
 See application file for complete search history.

(56) References Cited

U.S. PATENT DOCUMENTS

| 5,905,407 A | 5/1999 | Midya |
| 6,175,273 B1 | 1/2001 | Sigmon et al. |
| 6,914,487 B1 | 7/2005 | Doyle et al. |
| 7,102,427 B2 | 9/2006 | Matsumoto et al. |

(Continued)

FOREIGN PATENT DOCUMENTS

| CN | 1592089 A | 3/2005 |
| CN | 1592089 A | 3/2005 |

(Continued)

OTHER PUBLICATIONS

International Search Report and Written Opinion—PCT/EP2009/064632—ISA/EPO—Feb. 2, 2010.

(Continued)

*Primary Examiner* — Adolf Berhane
*Assistant Examiner* — Sisay G Tiku
(74) *Attorney, Agent, or Firm* — Patterson & Sheridan, LLP

(57) ABSTRACT

There is described a method of generating a power supply tracking a reference signal, comprising the steps of: filtering the reference signal; generating a first voltage in dependence on the filtered reference signal; generating a second voltage in dependence on the reference signal; and combining the first and second voltages to provide a power supply voltage.

24 Claims, 7 Drawing Sheets

(56) References Cited

U.S. PATENT DOCUMENTS

| | | | |
|---|---|---|---|
| 8,489,037 B2* | 7/2013 | Fudaba | H03F 1/0211 455/102 |
| 8,594,589 B2* | 11/2013 | Yamanouchi | H03F 1/0244 375/295 |
| 8,836,422 B2* | 9/2014 | Wimpenny | H03F 1/0222 323/355 |
| 9,106,182 B2 | 8/2015 | Wilson et al. | |
| 2003/0020558 A1* | 1/2003 | Tiihonen | H04W 52/367 333/17.1 |
| 2004/0121746 A1* | 6/2004 | Akamine | H04B 1/30 455/130 |
| 2005/0046474 A1 | 3/2005 | Matsumoto et al. | |
| 2006/0028271 A1* | 2/2006 | Wilson | H03F 1/025 330/199 |
| 2006/0214728 A1* | 9/2006 | Pan | H03F 3/1935 330/51 |
| 2007/0210771 A1* | 9/2007 | Wilson | H03F 1/0211 323/278 |
| 2008/0104432 A1* | 5/2008 | Vinayak | G06F 1/26 713/300 |
| 2008/0258831 A1 | 10/2008 | Kunihiro et al. | |
| 2009/0027119 A1 | 1/2009 | Williams et al. | |
| 2009/0054017 A1* | 2/2009 | Vilhonen | H03F 1/0277 455/118 |
| 2009/0102549 A1 | 4/2009 | Midya et al. | |
| 2009/0315620 A1 | 12/2009 | Yamanouchi et al. | |
| 2010/0201444 A1 | 8/2010 | Malmqvist et al. | |
| 2011/0234182 A1* | 9/2011 | Wilson | H03F 1/0227 323/234 |
| 2012/0139633 A1* | 6/2012 | Nasu | H03F 1/0277 330/254 |

FOREIGN PATENT DOCUMENTS

| | | |
|---|---|---|
| EP | 1202446 A2 | 5/2002 |
| GB | 2457764 A | 9/2009 |
| WO | 2005096481 A1 | 10/2005 |
| WO | WO-2005096481 A1 | 10/2005 |
| WO | 2007092195 A2 | 8/2007 |
| WO | WO-2007092195 A2 | 8/2007 |
| WO | 2009106632 A1 | 9/2009 |
| WO | WO-2009106632 A1 | 9/2009 |

OTHER PUBLICATIONS

"Related Chinese Patent Application No: 200980153602.8 Office Action", May 18, 2013, Publisher: CIPO, Published in: CN.

"Related GB Patent Application No. GB0820177.4 Examination Report", May 17, 2013, Publisher: Intellectual Property Office, Published in: GB.

"Parent U.S. Appl. No. 13/127,624 NonFinal Office Action", Sep. 22, 2014, Publisher: USPTO, Published in: US.

"British Office Action for British International Application No. GB0820177.4", Mar. 3, 2009, Publisher: British Intellectual Property Office, Published in: GB.

\* cited by examiner

US 9,722,543 B2

POWER SUPPLY STAGE

CROSS-REFERENCE TO RELATED APPLICATION(S)

Great Britain Patent Application No. 0820177.4, filed on Nov. 4, 2008, is incorporated herein by reference.

FIELD OF THE INVENTION

The present invention relates to supply stages for generating power supply voltages, and particularly to supply voltage stages which track the envelope of a reference signal.

BACKGROUND OF THE INVENTION

It is known in the art to provide efficient power supply generation circuitry for, in particular, power amplifier applications. Power amplifiers, for example radio frequency (RF) power amplifiers, typically have high peak-to-average (PAR) ratios. If a power supply voltage is provided which is sufficient to deal with the voltage peaks, then for a large portion of the operation of the amplifier the power supply voltages are unnecessarily high, and the operation of the power amplifier is highly inefficient.

For this reason, efficient power supply generation means have been developed. Typical techniques fall into the broad categories of envelope elimination and restoration (EER) and envelope tracking (ET).

An efficient envelope tracking voltages supply scheme is described in UK Patent No. 2398648 in the name of Nujira Limited.

Prior art efficient envelope tracking power supplies operate efficiently for narrowband signals. However for wideband signals, inefficiencies arise. This is due to excessive switching losses and distortion as a result of having to adapt the power supply to handle a wide range of frequencies.

It is an aim of the invention to provide an improved technique for efficiently providing a power supply voltage, preferably over an increased bandwidth.

SUMMARY OF THE INVENTION

In one aspect the invention provides a method of generating a power supply tracking a reference signal, comprising the steps of: filtering the reference signal; generating a first voltage in dependence on the filtered reference signal; generating a second voltage in dependence on the reference signal; and combining the first and second voltages to provide a power supply voltage.

The step of generating the first voltage may include tracking the filtered reference signal and the step of generating the second voltage comprises tracking the reference signal.

The step of generating the second voltage may comprise subtracting the power supply voltage from the reference signal.

The step of generating the second voltage may further comprise amplifying the subtracted signal.

The step of generating the second voltage may include delaying the reference signal, the second voltage being generated in dependence on the delayed reference signal.

The step of subtracting the power supply voltage from the reference signal may generate an error signal, and the step of amplifying the subtracted signal may amplify the error signal to generate a correction signal, wherein the correction signal forms the second voltage.

The steps of filtering the reference signal may comprise: filtering the reference signal with a first filter bandwidth to provide a first filtered reference signal; and filtering the reference signal with a second filter bandwidth to provide a second filtered reference signal; the step of generating the first voltage being in dependence on the first filtered reference signal; and the step of generating the second voltage being in dependence on the second filtered reference signal.

The second filter bandwidth may be broader than the first filter bandwidth.

The step of filtering the reference signal may comprise: filtering the reference signal with n-2 further filter bandwidths to provide n-2 further filtered reference signals, wherein the total number of filtered reference signals is n; generating n-2 further voltages in dependence on the n-2 further filtered reference signals, wherein the total number of generated voltages is n; and combining the n-2 further voltages with the combined first and second voltages by: combining each of the further voltages in cascaded stages, wherein for the $i^{th}$ stage, where i=3 to n, the $i^{th}$ generated voltage is combined with the combined voltage of the i-$1^{th}$ stage to provide a modified power supply voltage, the output of the $n^{th}$ stage forming the actual power supply voltage.

The method may further comprise providing the first voltage as a feedback input to the step of generating the first voltage.

The step of generating the second voltage may be further in dependence on the combined first and second voltages provided as a feedback signal.

The step of generating the $i^{th}$ generated voltage may be further in dependence on the combined voltage of the i stage provided as a feedback signal.

The method may further comprise generating a further voltage in dependence on the unfiltered reference signal, and combining the further voltage with the combined first and second voltages to provide the power supply voltage.

The method may further comprise generating a further voltage in dependence on the unfiltered reference signal, and combining the further voltage with the combined voltage of the $n^{th}$ stage.

In accordance with the invention there is also provided a method of generating a power supply tracking a reference signal, comprising the steps of: filtering, in a plurality n of filtering steps, the envelope signal, the filtering applied in each filtering step being different; generating, in a respective plurality n of voltage generation steps, a respective plurality of intermediate voltages in dependence on the respective filtered reference signals; receiving, in each of a plurality of n-1 voltage summation steps respectively associated with the $2^{nd}$ to $n^{th}$ voltage generation steps, the intermediate voltage generated in the respective generating step; receiving, in each of the plurality of n-1 voltage summation steps the output of the preceding summation step; generating, as an output of each summation step the sum of the two inputs; and providing the output of the n-$1^{th}$ summation step as the supply voltage.

In successive filtering steps the filtering bandwidth may be successively broadened.

The method may further comprise the steps of feeding-back the output of at least one summation step to the respective generating step, wherein the generating step generates the intermediate voltage in dependence on the feedback output.

The method may further comprise the step of feeding back the intermediate voltage generated in each of the generating steps to the input of generating step of the preceding generating step to thereby reduce a dc offset.

In another aspect the invention provides a method of generating a power supply tracking a reference signal, comprising the steps of: filtering the reference signal; generating an intermediate power supply signal in dependence on the filtered reference signal; summing the intermediate power supply signal with a correction signal to provide an output power supply signal; subtracting the output power supply signal from the reference signal to generate an error signal; and generating the correction signal in dependence on the error signal.

The method may further comprise the step of delaying the reference signal prior to performing the subtracting step.

The delay may correspond to the delay of the filtering, generating and summing steps.

The step of generating the intermediate power supply may be further adapted to remove a dc offset between the correction signal and the filtered signal.

The step of generating the correction signal may comprise linearly amplifying the error signal.

In accordance with a further aspect the invention provides an apparatus of generating a power supply tracking a reference signal, comprising the steps of: filtering the reference signal; generating a first voltage in dependence on the filtered reference signal; generating a second voltage in dependence on the reference signal; and combining the first and second voltages to provide a power supply voltage.

The step of generating the first voltage may include tracking the filtered reference signal and the step of generating the second voltage comprises tracking the reference signal.

The step of generating the second voltage may comprise subtracting the power supply voltage from the reference signal.

The step of generating the second voltage may further comprise amplifying the subtracted signal.

The step of generating the second voltage may include delaying the reference signal, the second voltage being generated in dependence on the delayed reference signal.

The step of subtracting the power supply voltage from the reference signal may generates an error signal, and the step of amplifying the subtracted signal may amplifies the error signal to generate a correction signal, wherein the correction signal forms the second voltage.

The steps of filtering the reference signal comprise: filtering the reference signal with a first filter bandwidth to provide a first filtered reference signal; and filtering the reference signal with a second filter bandwidth to provide a second filtered reference signal; the step of generating the first voltage being in dependence on the first filtered reference signal; and the step of generating the second voltage being in dependence on the second filtered reference signal.

The second filter bandwidth may be broader than the first filter bandwidth.

The step of filtering the reference signal may comprise: filtering the reference signal with n-2 further filter bandwidths to provide n-2 further filtered reference signals, wherein the total number of filtered reference signals is n; generating n-2 further voltages in dependence on the n-2 further filtered reference signals, wherein the total number of generated voltages is n; and combining the n-2 further voltages with the combined first and second voltages by: combining each of the further voltages in cascaded stages, wherein for the $i^{th}$ stage, where i=3 to n, the $i^{th}$ generated voltage is combined with the combined voltage of the i-1$^{th}$ stage to provide a modified power supply voltage, the output of the $n^{th}$ stage forming the actual power supply voltage.

The apparatus may further comprise providing the first voltage as a feedback input to the step of generating the first voltage.

The apparatus may be adapted to generate the second voltage further in dependence on the combined first and second voltages provided as a feedback signal.

The apparatus may be adapted to generate the $i^{th}$ generated voltage further in dependence on the combined voltage of the i stage provided as a feedback signal.

The apparatus may be adapted to generate a further voltage in dependence on the unfiltered reference signal, and combining the further voltage with the combined first and second voltages to provide the power supply voltage.

The apparatus may be adapted to generate a further voltage in dependence on the unfiltered reference signal, and combining the further voltage with the combined voltage of the $n^{th}$ stage.

In an aspect the invention provides an arrangement for generating a power supply tracking a reference signal, comprising: a plurality n of voltage generation stages, each comprising: a filter for filtering the reference signal, wherein the bandwidth of each filter is different; and a voltage generation stage for generating an intermediate supply voltage in dependence on the filtered reference signal; a plurality n-1 of voltage summation stages, associated with the $2^{nd}$ to $n^{th}$ voltage generation stages respectively, each adapted to: receive as a first input the intermediate supply voltage generated by the respective voltage supply generation stage; receive as a second input the output of the preceding summation stage; and generate as an output the sum of the first and second inputs, wherein the output of the n-1$^{th}$ summation stage is the output supply voltage.

In an aspect the invention provides an apparatus for generating a power supply tracking a reference signal, comprising of: means for filtering, in a plurality n of filtering steps, the envelope signal, the filtering applied in each filtering step being different; means for generating, in a respective plurality n of voltage generation steps, a respective plurality of intermediate voltages in dependence on the respective filtered reference signals; means for receiving, in each of a plurality of n-1 voltage summation steps respectively associated with the $2^{nd}$ to $n^{th}$ voltage generation steps, the intermediate voltage generated in the respective generating step; means for receiving, in each of the plurality of n-1 voltage summation steps the output of the preceding summation step; means for generating, as an output of each summation step the sum of the two inputs; and means for providing the output of the n-1$^{th}$ summation step as the supply voltage.

In successive filtering steps the filtering bandwidth may be successively broadened.

The apparatus may be adapted to feed-back the output of at least one summation step to the respective means for generating, wherein the means for generating generates the intermediate voltage in dependence on the feed-back output.

The apparatus may further be adapted to feed back the intermediate voltage generated in each of the generating steps to the input of generating step of the preceding generating step to thereby reduce a dc offset.

In another aspect the invention provides an arrangement for generating a power supply tracking a reference signal, comprising: a filter for filtering the reference signal; an intermediate power supply stage for generating an intermediate power supply signal in dependence on the filtered reference signal; a summer for summing the intermediate power supply signal with a correction signal to provide an output power supply signal; a subtractor for subtracting the output power supply signal from the reference signal to generate an error signal; and an amplifier for generating the correction signal in dependence on the error signal.

The arrangement may further comprise a delay stage at the input to the subtractor for delaying the reference signal.

The delay stage may be adapted to delay the reference signal by an amount corresponding to the delay of the filtering, generating and summing steps.

The amplifier may comprise a linear amplification stage.

The intermediate power supply stage may be an envelope tracking power supply stage for generating the intermediate power supply in dependence on the envelope of the reference signal.

BRIEF DESCRIPTION OF THE FIGURES

The invention is now described by way of example with reference to the accompanying figures, in which.

DETAILED DESCRIPTION

The invention is now described by way of example with reference to a number of exemplary embodiments. One skilled in the art will appreciate that the invention is not limited to the details of any embodiment described. In particular the invention is not limited to any specific technique for the implementation of an efficient power supply stage. Whilst a particularly efficient power supply stage is described in UK Patent No. 2398648, and is advantageously incorporated in embodiments of the invention, the invention is not limited to the use of such a specific efficient power supply stage. In general, the invention may preferably be implemented, in embodiments, utilising any efficient envelope tracking power supply stage.

Figure 1:
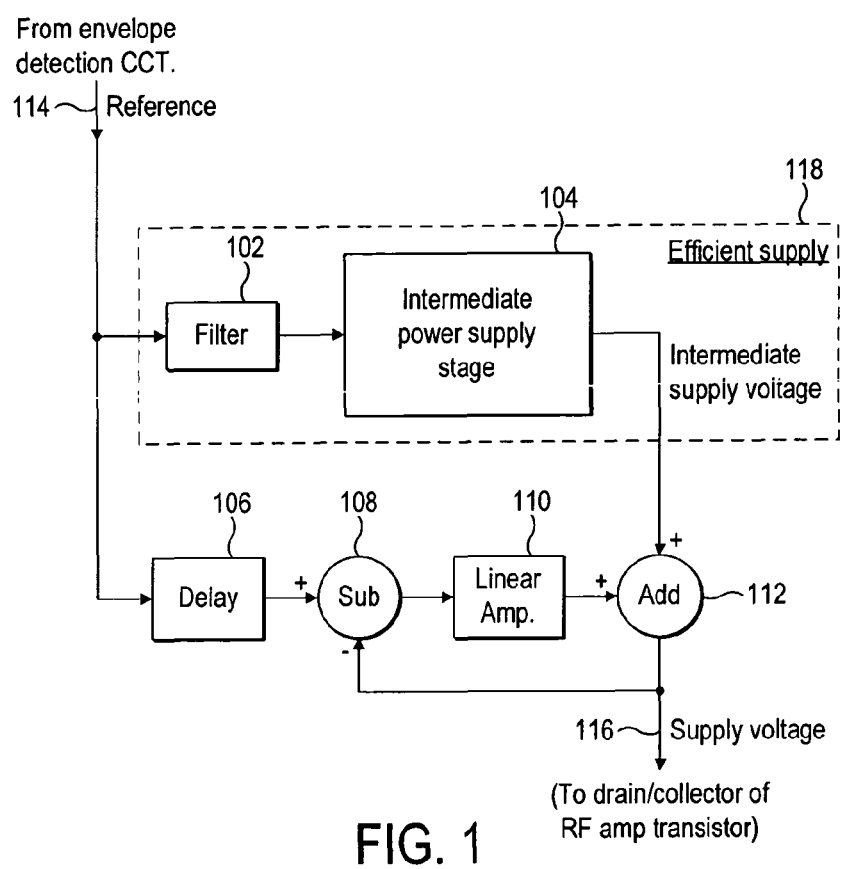
FIG. 1 illustrates an improved envelope tracking voltage supply stage in accordance with an embodiment of the invention.

FIG. 1 illustrates the broad principles of an exemplary arrangement in accordance with one aspect of the present invention.

With reference to FIG. 1, there is generally illustrated by reference numeral 118 an efficient power supply generation stage. As illustrated in FIG. 1, the efficient power supply generation stage 118 includes a filter 102 and an intermediate power supply stage 104. The filter 102 is connected to receive at its input a reference signal on line 114, and generate an output. The reference signal on line 114 is derived from, or represents, the envelope of a signal to be amplified. This signal may be derived from an envelope detection circuit. The output of the filter 102 forms an input to the intermediate power supply stage 104. The intermediate power supply stage 104 is preferably an efficient power supply stage, which generates at its output a supply voltage for delivery to an amplifier stage. However, in accordance with the principles of this invention, the supply voltage generated by the intermediate power supply voltage stage 104 at its output is considered to be an intermediate supply voltage, and is further modified as is discussed further hereinbelow.

It should be understood that the implementation of the intermediate power supply stage 104 may vary, but that a particularly preferred implementation is set forward in UK Patent No. 2398648. The implementation of the efficient supply stage 118 may also vary. In FIG. 1 there is shown a single intermediate power supply stage 104, with an associated filter 102 at its input. In other embodiments the efficient supply stage 118 may include multiple parallel or cascaded intermediate power supply stages 104. However in accordance with the principles of the invention, where multiple intermediate power supply stages 104 are provided in parallel in the efficient power supply stage 118, each of such stages will take its input through an associated filter, corresponding to input filter 102 associated with intermediate power supply stage 104.

Turning further to FIG. 1, it can be seen that the intermediate supply voltage generated at the output of the intermediate power supply stage 104 forms a first input to an adder or combiner stage 112, and generates an output forming an input to a subtractor 108. The subtractor 108 receives a further input from the output of a delay stage 106. The output of the subtractor 108 forms an input to a linear amplifier 110. The output of the linear amplifier 110 forms a further input to the adder 112. The subtractor 108 is arranged to subtract the signal at the output of the adder 112 from the signal at the output of the delay stage 106. The adder 112 is adapted to add the intermediate supply voltage signal at the output of the intermediate power supply stage 104 to the signal at the output of the linear amplifier 110. The output of the adder 112 on a line 116 also forms a supply voltage, preferably for an amplifier stage, and is preferably connected to the drain/collector terminal of an RF amplifier transistor.

The delay stage 106, subtractor 108, linear amplifier 110, and adder 112 are thus combined and connected in combination with the efficient supply stage 118 to form a clean-up loop for the supply voltage stage, as will be discussed in further detail hereinbelow. Not all of these elements are essential in order to achieve the benefits of the invention, the essential elements being apparent from the following discussion.

It should be noted that the generation of a supply voltage in accordance with the principles of this invention is not limited to the generation of a supply voltage for an RF amplifier arrangement, although it is particularly advantageous when used in such an arrangement.

The intermediate power supply stage 104 represents an existing power supply stage that gives very good efficiency over a narrow bandwidth, but does not have either enough bandwidth or linearity for a desired application. As such, an additional loop based on the linear amplifier 110 is added. This additional loop adds a signal to the output of the existing power supply stage so as to produce a full bandwidth signal that is closer to the final desired output signal than the existing power supply stage is capable of producing.

The signal to the intermediate power supply stage 104 is band limited by the filter 102 to ensure that the signal it processes is within the specified limits for the efficient operation of the power supply stage 104. The voltage supply generated by the power supply stage 104 is then provided as an input to the combiner 112, which additionally receives the output of the linear amplifier 110. These two signals are added together to provide a supply voltage on line 116 for delivery to the power supply terminal of an amplifier stage.

The modified output of the power supply stage provided on line 116 is additionally compared, in the subtractor 108, with the reference signal on line 114 which represents the required final envelope signal. The subtractor 108 generates an error signal at its output, which forms an input to the linear amplifier, and the amplified version thereof provided to the summer 112 forms a correction signal for correcting the output of the power supply stage 104.

As such, the discrepancy between the required output signal to be delivered on line 116 and the voltage supply output provided by the power supply stage 104 is reduced.

The filter stage 102 could be a low pass filter or a high pass filter. The purpose of the filter is to limit the bandwidth of the signal delivered to the intermediate power supply stage 104, the specific frequencies which are filtered not being important. The bandwidth of the filter will be implementation-dependent, dependent upon the bandwidth which the intermediate power supply stage 104 is designed to efficiently process. The purpose of the filter 102 is to band-limit the signal delivered to the intermediate power supply 104, so that such signal is efficiently processed.

The delay stage 106 is provided in order to compensate for delays caused by the efficient supply stage 118. This ensures that the signals provided to the subtractor 108 are time-aligned. In the event of an arrangement in which no time-misalignment occurs due to processing in other stages, or where some different compensation for time-misalignment is provided, the delay stage 106 may not be required. In addition the delay stage 106 is required to optimise performance, satisfactory performance being obtained without the delay stage 106 in certain implementations.

Figure 2:
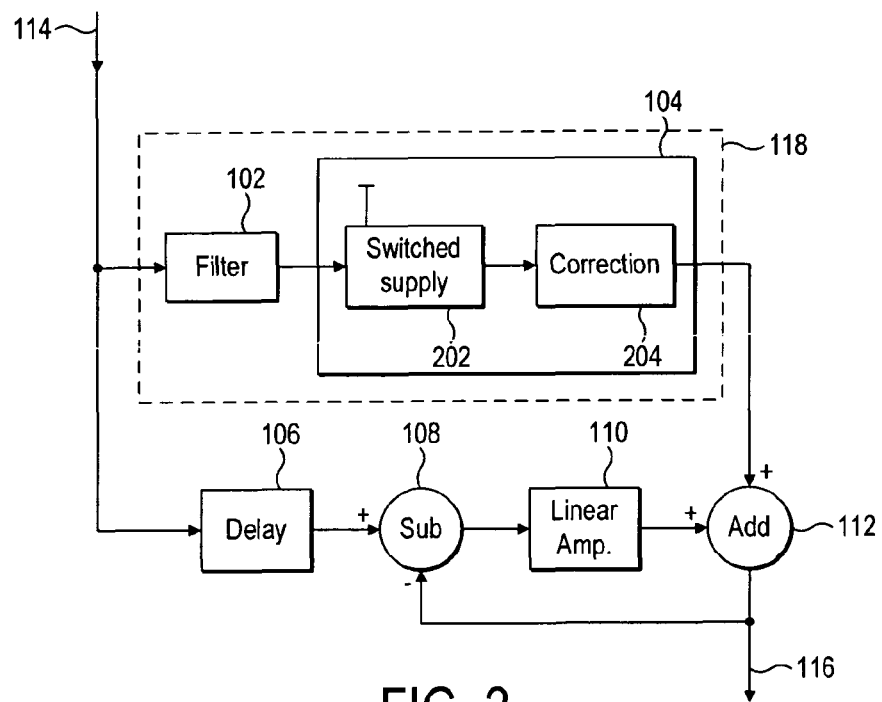
FIG. 2 illustrates an implementation of a power supply stage of the arrangement of FIG. 1 in an embodiment.

With reference to FIG. 2 there is illustrated an exemplary implementation of the intermediate power supply stage 104 of FIG. 1. This shows that the intermediate power supply stage 104 may comprise a switched supply 202 and a correction stage 204. This structure is consistent with that described in UK Patent No. 2398648. One of a plurality of available supplies is selected by the switched supply 202 in dependence upon the filtered reference signal, and the correction stage 204 operates to reduce an error in the selected supply voltage.

Figure 3:
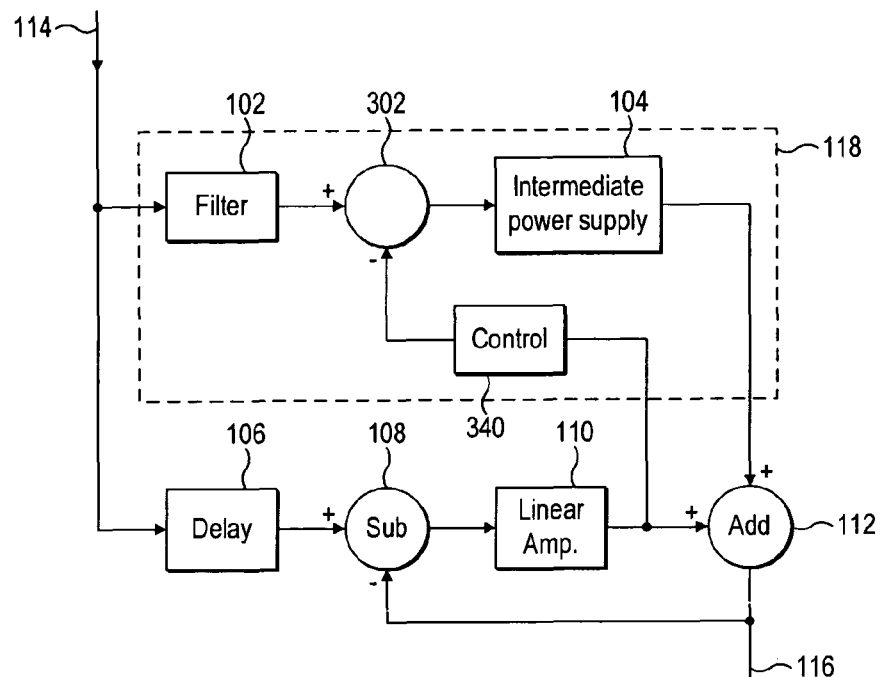
FIG. 3 illustrates a modification to the power supply stage of FIG. 3 in a further embodiment.

With reference to FIG. 3 there is illustrated a further adaptation to the arrangement of FIG. 1. There is provided a feedback path from the output of the linear amplifier 110 to the input of the intermediate power supply 104. The output of the linear amplifier 110 is fed to a control block 340, which provides an output to a combiner 302. The combiner 302 substracts the output of the control block 340 from the filtered reference signal at the output of the filter 102, and the resulting combined signal then provides the input to the intermediate power supply stage 104. This feedback into the efficient power supply stage removes any dc offset that would otherwise exist between the input and the output of the intermediate power supply stage 104. This dc offset, when present, is caused due to a dc offset between the input to the intermediate power supply stage 104 and the output of the delay stage 106. The control stage 340 provides the necessary dc offset compensation in dependence on the signal at the output of the linear amplifier 110.

Thus a measured signal is derived from the linear amplifier output that is fed into a further input of the efficient power supply stage, that ensures the efficient power stage does not have any dc or low frequency offset with respect to the linear amplifier.

The additional features of FIG. 3, for the removal of dc offset, are only required when dc offset is present and its removal is required. If no dc offset is present, then the additional features of FIG. 3 are not required.

Figure 4:
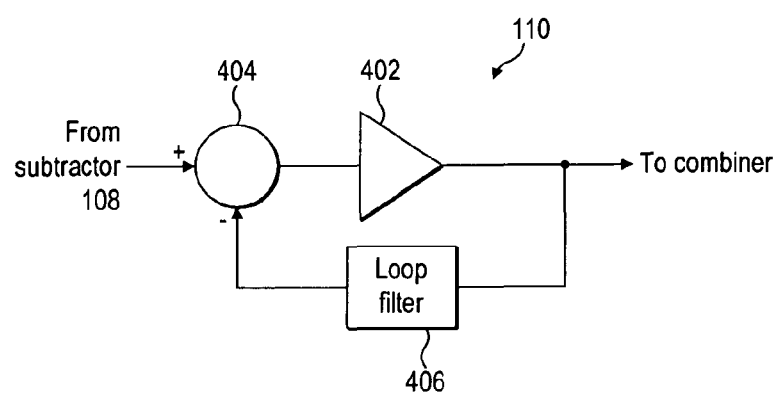
FIG. 4 illustrates an implementation of a linear amplification stage of FIG. 1 in a further embodiment.

With reference to FIG. 4 there is shown an exemplary implementation of the linear amplifier 110 of FIGS. 1 to 3. As illustrated in FIG. 4, the linear amplifier 110 is preferably implemented as an arrangement comprising an amplifier stage 402, a loop filter 406, and a combiner 404. The output of the subtractor 108 forms a first input to the combiner 404, and provides an output which forms the input to the amplifier 402. The output of the amplifier 402 forms the input to the adder stage 112, and additionally forms an input to the loop filter 406. The output of the loop filter forms the second input to the combiner 404. The combiner 404 operates to subtract the output of the loop filter from the output of the subtractor stage 108.

The linear amplifier 110 is preferably implemented as a class-AB amplifier 402. The class-AB amplifier 402 is preferably a high bandwidth linear amplifier.

Feedback is preferably provided around the class-AB amplifier by the loop filter 406. In order to minimise power dissipation in the class-AB amplifier 402, it is essential to minimise its output. Therefore in the preferred arrangement, to minimise the amplifier output, the loop filter 406 is used.

The arrangements described with reference to FIGS. 1 to 4 thus provide improvements over prior art techniques in allowing the efficient generation of a wideband power supply signal. The majority of the power is still handled by the efficient power supply stage 118, and therefore efficiency is maintained at a reasonable level. Even if the filter 102 is a narrowband filter, efficiencies are still obtained.

The additional loop based around the linear amplifier 110, which may be referred to as a clean-up loop, has additional advantages. It allows the linearity of the power supply generation stage to be increased to thereby reduce distortion. Just reducing the distortion on its own would be a benefit, independent of whether wideband signal. Therefore the arrangement described has two advantageous benefits, and may be used to: (i) allow the efficient generation of a power supply signal with increased bandwidth; (ii) to facilitate the reduction of distortion; or (iii) to achieve both (i) and (ii).

It should be noted, with reference to the embodiment of FIG. 1, that the output of the subtractor 108 is dominated by high frequencies because the intermediate supply stage 104 outputs the low frequency part of the output signal such that the extra loop based around the linear amplifier 110 provides for high frequency correction (on the assumption that the filter 102 filters the high frequency signal).

Figure 5:
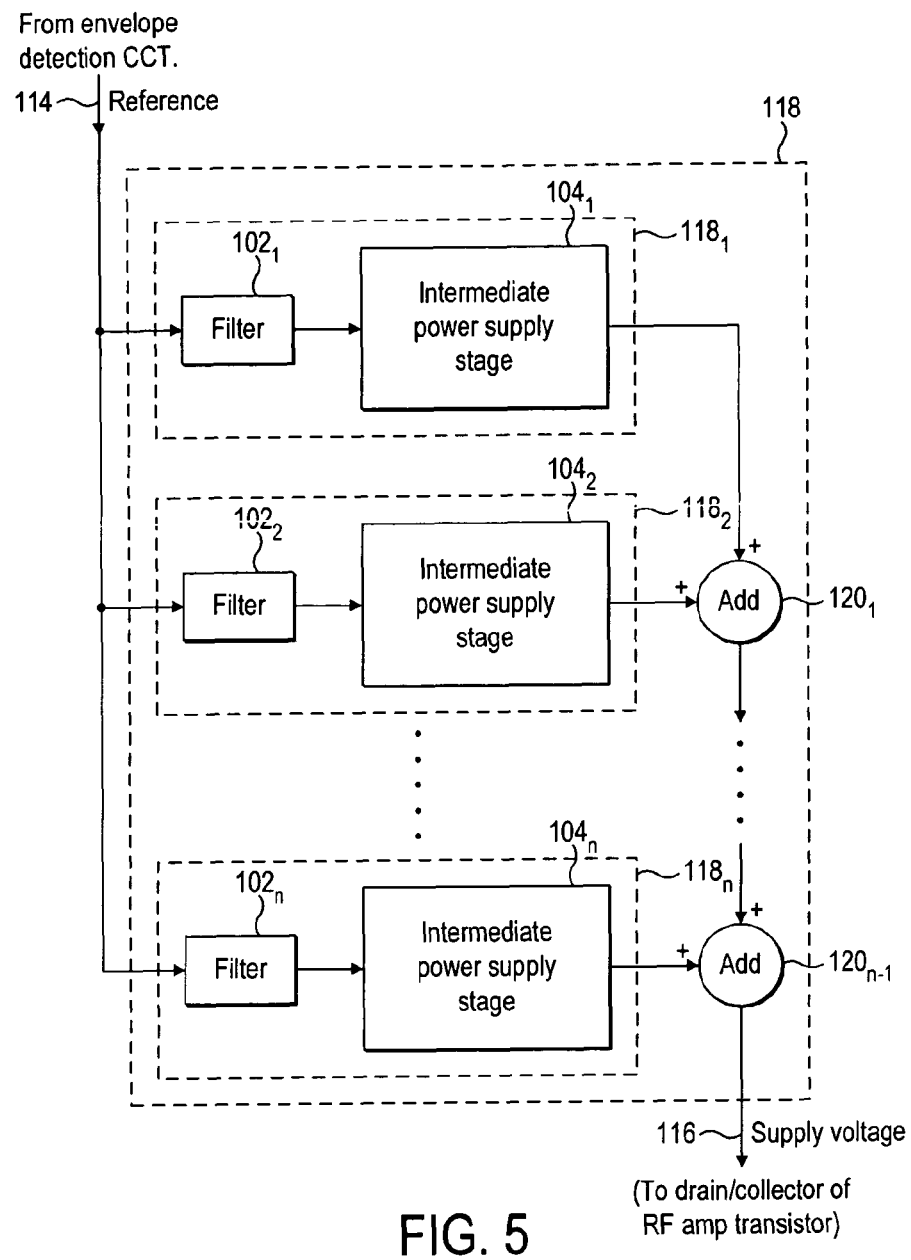
FIG. 5 illustrates a voltage supply stage in accordance with an embodiment of the invention.

The general principles of another aspect of the invention in accordance with a set of preferred embodiments are illustrated with respect to FIG. 5. It should be noted that, throughout the description, where elements in one Figure correspond to those in another Figure like reference numerals are used.

In FIG. 5 it can be seen that the efficient power supply stage 118, previously shown in FIGS. 1 to 3, is implemented as a plurality n of efficient power supply stages denoted by reference numerals $118_1$ to $118_n$. Each includes a respective "intermediate" power supply stage, identified by reference numerals $104_1$ to $104_n$ respectively.

Each efficient power supply stage $118_1$ to $118_n$ is associated with a respective filter $102_1$ to $102_n$. In general each filter 102 and power supply stage 104 combination can be considered a voltage generation stage, denoted by reference numerals $118_1$ to $118_n$.

Each of the filters $102_1$ to $102_n$ receives the reference signal on line 114. The filters are arranged such that they have different bandwidths. Thus the signal delivered to each of the intermediate power supply stages $104_1$ to $104_n$ is different in dependence upon the characteristics of the associated filters $102_1$ to $102_n$.

In one arrangement, each filter may be arranged such that it filters a different set of frequencies. In another arrangement each filter may be arranged such that they are of successively broader (or narrower) bandwidths. Thus the filter $102_1$ may be a narrowband filter, the filter $102_2$ being a wider bandwidth filter encompassing the bands of the filter $102_1$, and the filter $102_n$ being a wideband filter but encompassing the bands of all previous filters.

The more efficient a tracking power supply is, the higher the amount of distortion generated. If such a power supply handles a wide bandwidth, not only will the efficiency be compromised, but the distortion will be manifested over a much broader range of frequencies. Conversely, a linear stage will be able to handle a wide bandwidth stage with minimal distortion, but the efficiency will be poor. On account of this, the most efficient power supply stage will have a filter that restricts the signal input to the best signal bandwidth efficiency compromise, and since such a supply generates the most distortion, it is preferably placed at the top of the cascade so that subsequent supplies will suppress any distortion. As the cascade progresses towards the output, a progression of supplies that handle wider bandwidths with lower distortion and progressively lower efficiency is preferably used. The more linear power supplies towards the output of the cascade will remove some of the distortion created by the more efficient supplies further back, such that the final stage of the arrangement of FIG. 4, denoted by reference numeral $118_n$, has less distortion to correct.

In general the power supply stage 118 preferably includes n stages as illustrated in FIG. 5, where n is 2 or greater.

As can be seen in FIG. 5, each filter $102_1$ to $102_n$ receives the reference signal on line 114. The output of the respective filters forms the input to the respective intermediate power supply stages $104_1$ to $104_n$. The output of each supply stage $118_1$ to $118_n$, provided by the output of the intermediate power supply stages $104_1$ to $104_n$ respectively, is combined with the combined output of all previous stages in the cascade. For this purpose, each of the stages $118_2$ to $118_n$ is associated with a respective combiner or adder denoted by reference numerals $120_1$ to $120_{n-1}$. Thus, as can be seen in FIG. 5, a first combiner $120_1$ is associated with the supply stage $118_2$, and combines the output of the intermediate power supply stage $104_2$ with the output of the intermediate power supply $104_1$. This combined output then provides a first input to a combiner $120_2$ (not shown) which will combine this with the output of the intermediate power supply stage $104_3$ (not shown). As shown in FIG. 5, the final combiner $120_{n-1}$ combines the output of the intermediate power supply stage $104_n$ with an output provided by a combiner $120_{n-2}$ (not shown) which represents the cumulative supply voltage for all previous stages in the cascade. The combiner $102_{n-1}$ provides the final output voltage on line 116 for the efficient power supply stage 118.

It should be noted that the arrangement of FIG. 5 sets out an exemplary arrangement of the efficient supply stage 118 of FIG. 1. The arrangement of FIG. 1 is not limited to the implementation of FIG. 5. Similarly, the arrangement of FIG. 5 is not limited to the implementation if FIG. 1. The supply voltage of FIG. 5 on line 116 may be provided directly to a power amplifier supply mode, or may form an input to the "clean-up" loop based around the linear amplifier 110 as shown in FIG. 1.

Preferably, in the arrangement of FIG. 5 one or more of the filters 102 incorporates a delay such that the outputs of respective voltage generation stages can be time-aligned, similar to the delay stage 106 of FIG. 1.

Figure 6:
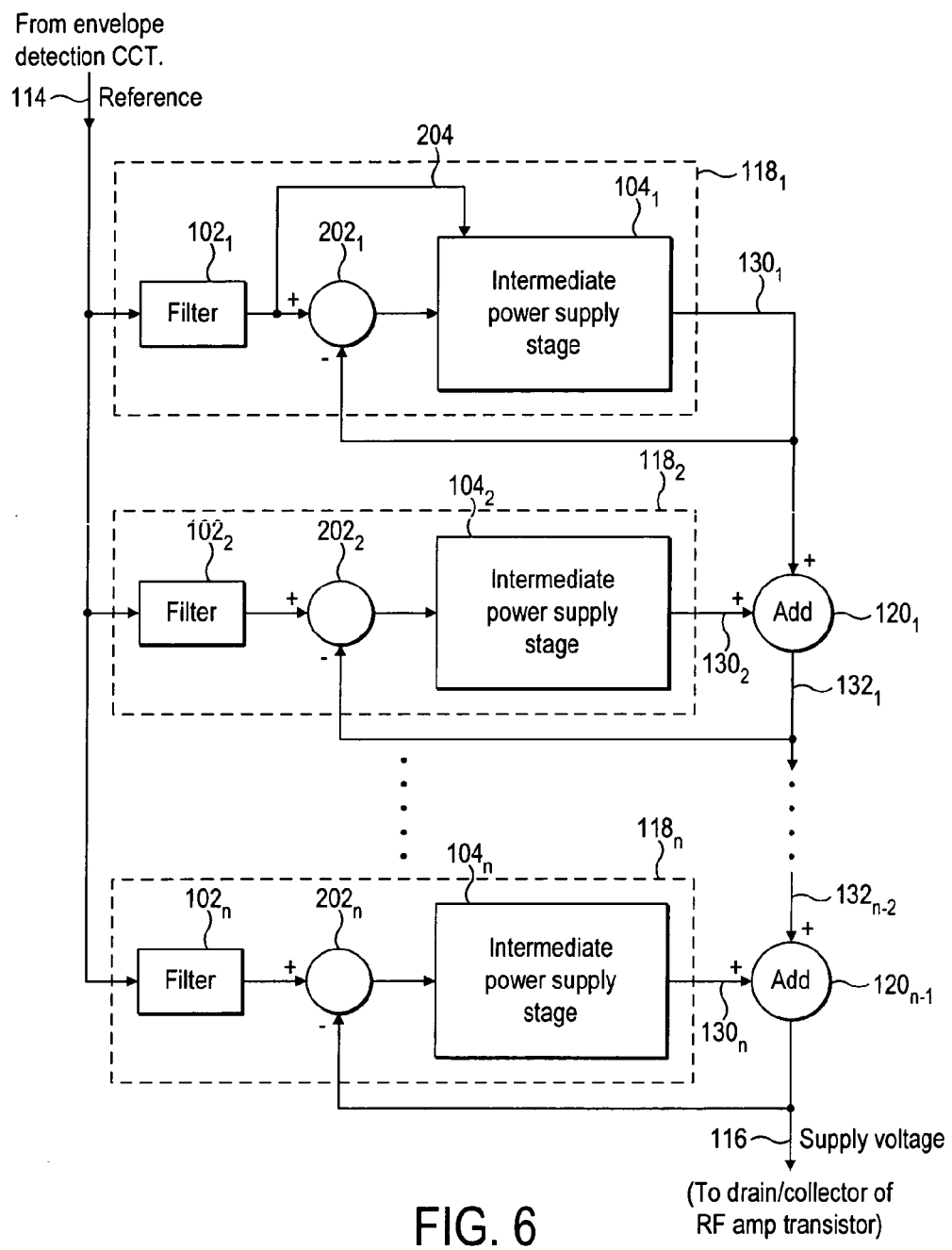
FIG. 6 illustrates a modification to the voltage supply stage of FIG. 5 in accordance with a further embodiment.

With reference to FIG. 6 there is illustrated a modification to the arrangement of FIG. 5, wherein each voltage generation stage $118_1$ to $118_n$ receives a feedback signal from the combined output of its associated combiner, to remove an error component from the input to the intermediate power supply stage. This removes a frequency portion of the signal to be handled by the intermediate power supply stage, such that each intermediate power supply stage can be implemented more efficiently.

Thus, as can be seen in FIG. 6, each of the stages $118_1$ to $118_n$ is provided with an additional combiner $202_1$ to $202_n$, positioned between the respective filter 102 output and the output to the respective intermediate power supply stage 104. Thus one input to each of the combiners $202_1$ to $202_n$ is taken from the output of the respective filter, and the output of the combiners $202_1$ to $202_n$ forms an input to the respective supply stages. A second input to the combiners $202_1$ to $202_n$ is derived from the cumulative supply determined at the output of the respective stage. For the first stage $118_1$, this is simply the output of the stage itself on line $130_1$, and this is fed back into the combiner $202_1$. For subsequent stages, this is the output of the associated combiner $120_1$ to $120_{n-1}$. Thus, for example, for the voltage in supply stage $118_2$, the combiner $202_2$ receives its second input from the output of the adder $120_1$, on line $132_1$.

In FIG. 6, for the voltage generation stage 118, there is also shown a feedforward path 204 from the output of the filter $102_1$ to the intermediate power supply stage $104_1$. This is an optional correction which may provide certain efficiencies: the feedforward path may reduce the signal processing burden on the intermediate power supply stage $104_1$. Although shown in the voltage generation stage 118 of FIG. 6, this is purely illustrative, and such a feedforward path may be provided in none, some, or all of the voltage generation stages $118_1$ to $118_n$.

Figure 7:
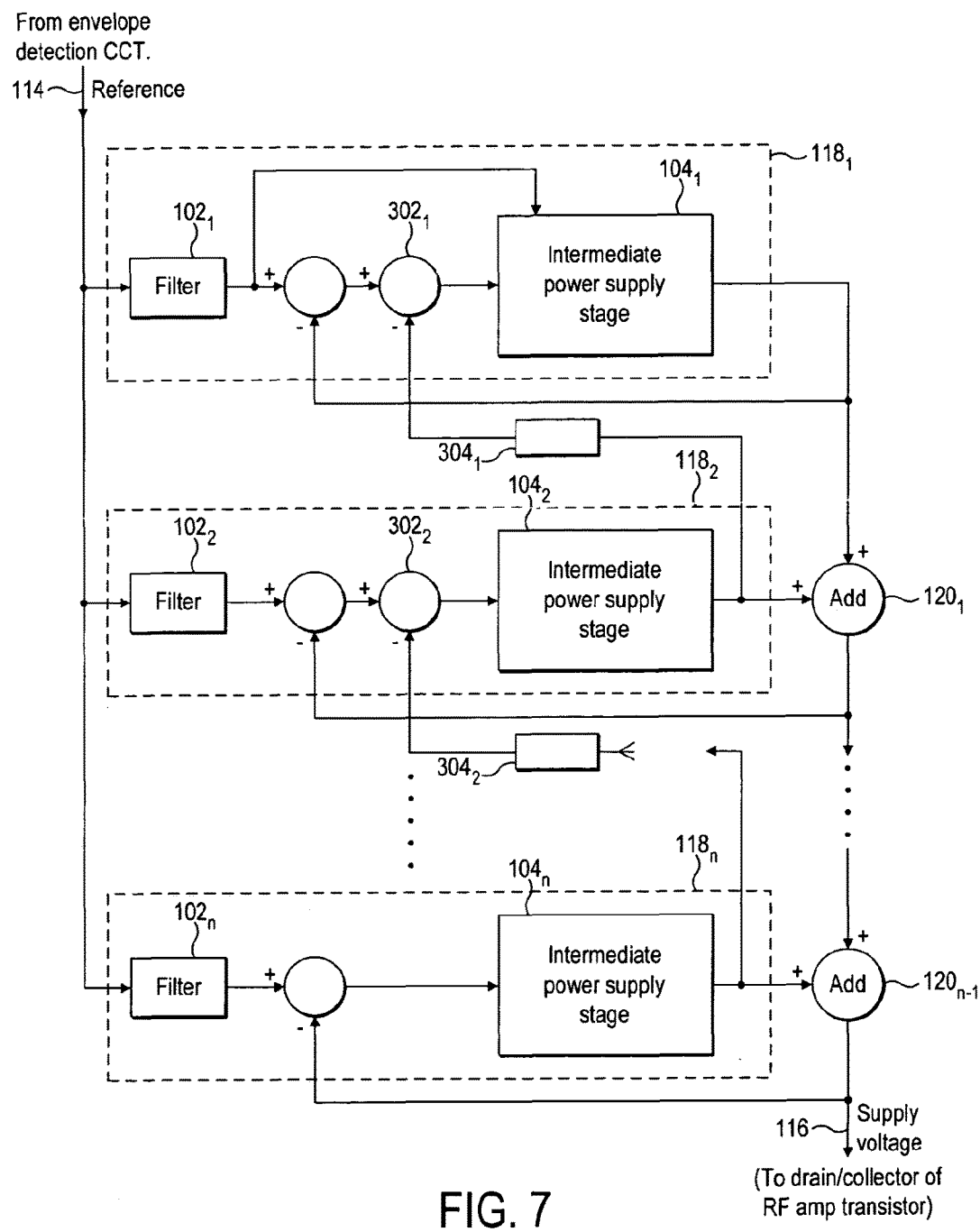
FIG. 7 illustrates a modification to the voltage supply of FIG. 6 in accordance with a still further modification.

It can be seen that, in an arrangement in which n=2, and the filter $102_2$ is an all-pass filter, the arrangement of FIG. 7 is transformed to the arrangement of FIG. 1.

With reference to FIG. 7 there is illustrated a further modification to the arrangement of FIGS. 5 and 6, to allow for dc offset compensation. In this arrangement the outputs of the $2^{nd}$ to $n^{th}$ intermediate power supply stages $118_2$ to $118_n$ are fed back to the inputs respectively of the first to $(n-1)^{th}$ intermediate power supply stages $118_1$ to $118_{n-1}$, via control blocks 304. Control blocks 304 are adapted to operate on the outputs of the intermediate power supply stages $104_2$ to $104_n$ to correct for a dc offset between the signals at the input to the intermediate power supply stages and the signals at the output thereof.

Thus, as can be seen in FIG. 7, an additional combiner $302_1$ to $302_2$ is added to each of the stages $118_1$ to $118_{n-1}$. These combiners take as a first input the intended input to the intermediate power supply stages, and as a second input the fed back output of the immediately succeeding intermediate power supply stage delivered through the control circuit $304_1$ to $304_n$ respectively. The output of the combiners $302_1$ to $302_n$ is then provided as the input to the intermediate power supply stage, with dc offset removed.

The principle of dc offset correction in FIG. 7 is the same as the principle of dc offset correction in FIG. 3.

Figure 8:
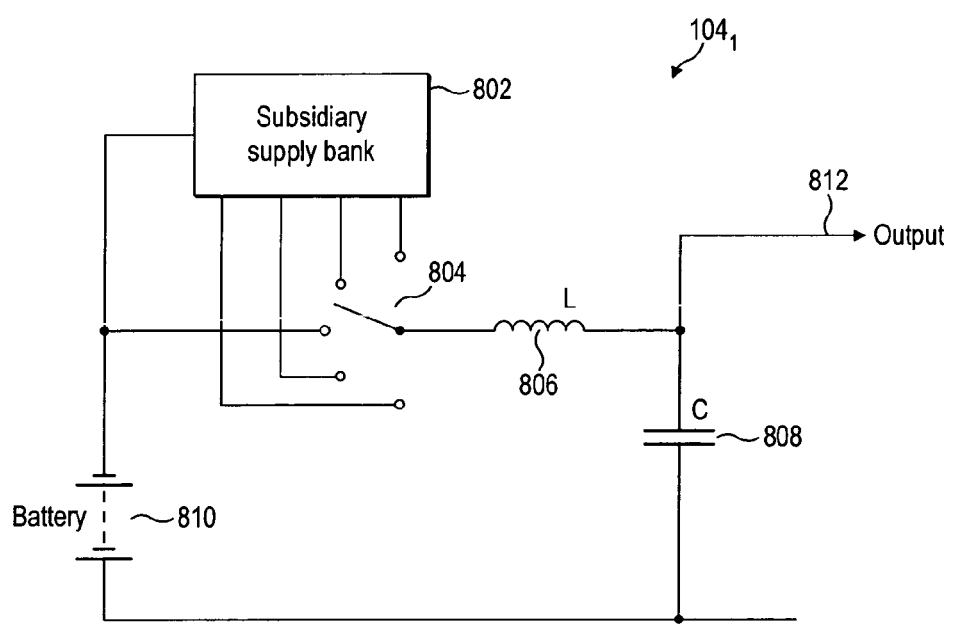
FIG. 8 illustrates an exemplary implementation of a part of the voltage supply stage of the embodiments of any one of FIGS. 5 to 7.

With reference to FIG. 8 there is illustrated an exemplary implementation of a switched mode power supply circuit which may be implemented as the intermediate power supply stage $104_1$. Preferably the intermediate power supply stages $104_2$ to $104_n$ are implemented as fast, highly accurate power supply stages, either in combination with a switched supply stage such as that shown in FIG. 8 or simply as correction stages.

As can be seen in FIG. 8, the power supply stage $104_1$ may include a subsidiary supply bank 802, a switch array 804, an inductor 806 having inductance value L, a capacitor 808 having capacitive value C, and one or more batteries 810. The switch 804 is controlled to connect one of a plurality of supplies from the subsidiary supply bank 802 to the input of the inductor, and the inductor-capacitor combination 806, 808 operate to filter such signal and provide it at the output 412. The filtering operation averages the signal selected by the switch supply.

With reference to FIG. 8, the switched mode supply shown operates at a reduced bandwidth. The switched output of the stage will therefore be reduced in comparison with the final envelope of the output voltage supply generated by the overall stage. Thus it may be possible to connect the switched output supply stage directly to the battery rather than just to the outputs of a switched mode supply. The arrangement of FIG. 8 is designed to be adaptive so that as much power as possible is drawn direct from the battery. This means that one stage of power conversion losses is reduced.

The combiners 120 of FIGS. 5 to 7 may be implemented, in a preferred embodiment, by suitable combinations of inductors or transformers.

The invention has been described with reference to particular embodiments in order to convey an understanding thereof. One skilled in the art will appreciate that the invention is not limited to the details of any specific embodiment described. In addition the features of any embodiments may be utilised in isolation or combination. The scope of protection afforded by the invention is defined by the appended claims.

The invention claimed is:

1. A method of generating a power supply voltage tracking a reference signal, comprising:
generating a plurality of filtered reference signals by filtering the reference signal such that the filtered reference signals each have different bandwidths, wherein filtering the reference signal comprises:
filtering the reference signal with a first filter bandwidth to provide a first filtered reference signal;
filtering the reference signal with a second filter bandwidth to provide a second filtered reference signal; and
filtering the reference signal with n-2 further filter bandwidths to provide n-2 further filtered reference signals, wherein a total number of filtered reference signals is n;
generating a first voltage in dependence on the plurality of filtered reference signals, wherein the plurality of filtered reference signals comprises the first and the second filtered reference signals;
generating n-2 further voltages in dependence on the n-2 further filtered reference signals, wherein a total number of generated voltages is n;
combining the n-2 further voltages with the generated first voltage by combining each of the n-2 further voltages in cascaded stages, wherein for an $i^{th}$ stage, where i=3 to n, an $i^{th}$ generated voltage is combined with a combined voltage of an i-$1^{th}$ stage to provide a modified power supply voltage, an output of the $n^{th}$ stage forming the first voltage;
generating a second voltage in dependence on the reference signal; and
combining the first and second voltages to provide the power supply voltage.

2. The method of claim 1, wherein generating the first voltage includes tracking the plurality of filtered reference signals and generating the second voltage comprises tracking the reference signal.

3. The method of claim 1, wherein generating the second voltage comprises subtracting the power supply voltage from the reference signal to generate a subtracted signal.

4. The method of claim 3, wherein generating the second voltage further comprises amplifying the subtracted signal.

5. The method of claim 4, wherein the subtracted signal comprises an error signal, and amplifying the subtracted signal amplifies the error signal to generate a correction signal, wherein the correction signal forms the second voltage.

6. The method of claim 1, wherein generating the second voltage includes delaying the reference signal, the second voltage being generated in dependence on the delayed reference signal.

7. The method of claim 1, wherein the second filter bandwidth is broader than the first filter bandwidth.

8. The method of claim 1, further comprising:
generating a first intermediate power supply voltage based on a feedback input signal; and
combining the first filtered reference signal with the first intermediate power supply voltage to generate the feedback input signal, wherein the first voltage is generated based, at least in part on the first intermediate power supply voltage.

9. The method of claim 1, wherein generating the second voltage is further in dependence on the combined first and second voltages provided as a feedback signal.

10. The method of claim 1, wherein generating the $i^{th}$ generated voltage is further in dependence on the combined voltage of the $i^{th}$ stage provided as a feedback signal.

11. The method of claim 1, further comprising:
generating a further voltage in dependence on an unfiltered version of the reference signal; and
combining the further voltage with the combined first and second voltages to generate the power supply voltage.

12. The method of claim 1, further comprising generating a further voltage in dependence on an unfiltered version of the reference signal, and combining the further voltage with the combined voltage of the $n^{th}$ stage.

13. The method of claim 1, wherein the reference signal is derived from an envelope of a signal to be amplified.

14. An apparatus for generating a power supply voltage tracking a reference signal, comprising:
means for generating a plurality of filtered reference signals each having a different bandwidth, comprising means for filtering the reference signal, wherein the means for filtering the reference signal comprises:
means for filtering the reference signal with a first filter bandwidth to provide a first filtered reference signal; and
means for filtering the reference signal with a second filter bandwidth to provide a second filtered reference signal;

means for filtering the reference signal with n-2 further filter bandwidths to provide n-2 further filtered reference signals, wherein a total number of filtered reference signals is n;

means for generating a first voltage in dependence on the plurality of filtered reference signals, wherein the means for generating the first voltage is configured to generate the first voltage in dependence on the first and the second filtered reference signals, wherein the second filter bandwidth is broader than the first filter bandwidth;

means for generating n-2 further voltages in dependence on the n-2 further filtered reference signals, wherein a total number of generated voltages is n;

means for combining the n-2 further voltages with the generated first voltage by combining each of the n-2 further voltages in cascaded stages, wherein for an $i^{th}$ stage, where i=3 to n, an $i^{th}$ generated voltage is combined with a combined voltage of an i-$1^{th}$ stage to provide a modified power supply voltage, an output of the $n^{th}$ stage forming the first voltage;

means for generating a second voltage in dependence on the reference signal; and means for combining the first and second voltages to provide the power supply voltage.

15. The apparatus of claim 14, wherein the means for generating the first voltage includes means for tracking the plurality of filtered reference signals and the means for generating the second voltage comprises means for tracking the reference signal.

16. The apparatus of claim 14, wherein the means for generating the second voltage comprises means for subtracting the power supply voltage from the reference signal to generate a subtracted signal.

17. The apparatus of claim 16, wherein the means for generating the second voltage further comprises means for amplifying the subtracted signal.

18. The apparatus of claim 17, wherein subtracted signal comprises an error signal, and the means for amplifying the subtracted signal is configured to amplify the error signal to generate a correction signal, wherein the correction signal forms the second voltage.

19. The apparatus of claim 14, wherein the means for generating the second voltage includes means for delaying the reference signal, the means for generating the second voltage being configured to generate the second voltage in dependence on the delayed reference signal.

20. The apparatus of claim 14, further comprising:
means for generating a first intermediate power supply voltage based on a feedback input signal; and
means for combining the first filtered reference signal with the first intermediate power supply voltage to generate the feedback input signal, wherein the means for generating the first voltage is configured to generate the first voltage based, at least in part, on the first intermediate power supply voltage.

21. The apparatus of claim 14, wherein the means for generating the second voltage is configured to generate the second voltage further in dependence on the combined first and second voltages provided as a feedback signal.

22. The apparatus of claim 14, wherein the $i^{th}$ generated voltage is further generated in dependence on the combined voltage of the $i^{th}$ stage provided as a feedback signal.

23. The apparatus of claim 14, further comprising:
means for generating a further voltage in dependence on an unfiltered version of the reference signal; and
means for combining the further voltage with the combined first and second voltages to generate the power supply voltage.

24. The apparatus of claim 14, further comprising:
means for generating a further voltage in dependence on an unfiltered version of the reference signal; and
means for combining the further voltage with the combined voltage of the $n^{th}$ stage.

* * * * *